(12) United States Patent
Klomsdorf et al.

(10) Patent No.: US 6,556,814 B1
(45) Date of Patent: Apr. 29, 2003

(54) MEMORY-BASED AMPLIFIER LOAD ADJUST SYSTEM

(75) Inventors: Armin Klomsdorf, Spring Grove, IL (US); Luke Edward Winkelmann, Mundelein, IL (US); Michael Landherr, Cary, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/358,674

(22) Filed: Jul. 22, 1999

(51) Int. Cl.[7] .................................................. H04B 1/04
(52) U.S. Cl. ....................................... 455/121; 455/129
(58) Field of Search ................................ 455/121, 123, 455/125, 127, 129, 120, 522

(56) References Cited

U.S. PATENT DOCUMENTS

| | | | |
|---|---|---|---|
| 4,965,607 A | * 10/1990 | Wilkins et al. | 333/17.3 |
| 5,170,496 A | * 12/1992 | Viereck | 333/17.1 |
| 5,673,001 A | 9/1997 | Kim et al. | |
| 5,862,458 A | * 1/1999 | Ishii | 455/107 |
| 6,215,987 B1 | * 4/2001 | Fujita | 330/51 |
| 6,246,727 B1 | * 6/2001 | Larsson et al. | 375/304 |
| 2001/0014587 A1 | 8/2001 | Ichihara | |

FOREIGN PATENT DOCUMENTS

KR   1999-023367   3/1999

* cited by examiner

*Primary Examiner*—Daniel Hunter
*Assistant Examiner*—Nick Corsaro
(74) *Attorney, Agent, or Firm*—Paul J. Bartusiak; Randall S. Vaas

(57) ABSTRACT

A power amplifier load adjust system includes a power amplifier and a variable impedance network coupled to the output of the power amplifier. The variable impedance network presents a plurality of impedances to the output of the power amplifier responsive to a load control signal. A control circuit generates a transmit power command and a channel frequency command. Memory stores a plurality of control values as a function of output power and frequency. A processing circuit coupled to the variable impedance network, the control circuit, and the memory retrieves the plurality of control values and uses them to generate the load control signal in response to the transmit power command and the channel frequency command.

15 Claims, 6 Drawing Sheets

MEMORY-BASED AMPLIFIER LOAD ADJUST SYSTEM

CROSS REFERENCE TO RELATED APPLICATION

This application is related to co-pending U.S. patent application Ser. No. 09/359,586 filed herewith by Alberth et al. and entitled "LOAD ENVELOPE FOLLOWING AMPLIFIER SYSTEM," Ser. No. 09/359,225 filed herewith by David Schlueter and entitled "POWER AMPLIFYING CIRCUIT WITH SUPPLY ADJUST TO CONTROL ADJACENT AND ALTERNATE CHANNEL POWER," Ser. No. 09/358,884 filed herewith by Klomsdorf et al. and entitled "POWER AMPLIFYING CIRCUIT WITH LOAD ADJUST FOR CONTROL OF ADJACENT AND ALTERNATE CHANNEL POWER," and Ser. No. 09/359,280 filed herewith by Alberth et al. and entitled "LOAD ENVELOPE ELIMINATION AND RESTORATION AMPLIFIER SYSTEM."

FIELD OF THE INVENTION

This invention generally relates to a high efficiency power amplifier system. More specifically, this invention relates to a power amplifier with a variable impedance network coupled to an output of the power amplifier.

BACKGROUND OF THE INVENTION

The power amplifier is a key technology in portable radiotelephone design. In cellular telephones, the power amplifier has a large impact on the available talk time. This is because the power amplifier consumes a significant amount of power relative to the other circuitry within the cellular telephone. One parameter defining how much power the power amplifier consumes is the power amplifier efficiency. This efficiency, for example can be the power added efficiency. For power amplifiers using bipolar devices, a collector efficiency is another efficiency parameter. For FET-based power amplifiers, the drain efficiency is an additional parameter used to characterize amplifier efficiency.

Attempts have been made to increase the efficiency of power amplifiers by varying the load impedance presented to the power amplifier. U.S. Pat. No. 5,673,001 (hereinafter '001) is shows several examples of load switching. In a first embodiment, the radio frequency (RF) input signal and the RF output signal are sampled. A control circuit develops a control signal based on the input-output signal comparison. A voltage variable capacitor (VVC) at the output of the power amplifier is varied in response to the control signal to skew the operating point of the power amplifier closer to a maximum efficiency operating point.

In a second embodiment of the prior art, only a sampled portion of the RF output signal of the power amplifier is used to generate the load control signal for control of the VVC at the power amplifier output. Once again, a sample of the power of the output signal is used to control the impedance of presented by the VVC.

In a third embodiment of the prior art, a saturation detection loop is utilized. In cellular systems, there is typically an output power control loop in the transmitter, and the output power is varied over a range of output powers. For example, if the mobile unit is close to the base station, the mobile unit will not have to transmit as much output power. In the third embodiment of the prior art, the output signal power is measured to develop the control signal. The voltage of the control signal is compared to the supply voltage, and if the control signal voltage is within a predefined range from the supply voltage, the VVC impedance is adjusted. Without this saturation detect loop, the VVC network could adjust to a high efficiency impedance but set the impedance to one for which the PA cannot deliver the necessary output power. Thus, the VVC could present an impedance to the power amplifier output to cause the power amplifier to saturate at an output power that is lower than the desired output power.

The embodiments described in the prior art are very useful for constant envelope modulation schemes such as frequency modulation in the advanced mobile phone system (AMPS) or gausian minimum shift keying (GMSK) in the group special mobile (GSM) digital cellular telephone system. However, other digital cellular telephone systems employ modulation schemes that have an amplitude modulation (AM) envelope impressed upon the RF modulated signal as opposed to a constant envelope.

For example, the cellular telephone interim standard (IS)-136 utilizes time division multiple access (TDMA) and requires $\pi/4$ differential quadrature phase shift keying (DQPSK), and the cellular telephone standard (IS-95) utilizes code division multiple access (CDMA) and requires offset QPSK (OQPSK). Yet another cellular telephone system employs quadrature amplitude modulation (QAM) that also has an AM envelope on the RF modulated signal.

The prior art systems rely upon real-time measurements to vary the load impedance as a function of output power. That becomes inadequate for linear modulation schemes. The prior art systems do nothing to address the adjacent channel power (ACP) that is transmitted by the power amplifier. In systems using linear modulation, if the power amplifier does not faithfully reproduce the AM envelope, the power amplifier will transmit too much ACP. The radiotelephone employing the power amplifier would then not comply with the cellular standard requirement for ACP. Thus, the prior art adjusts the load impedance based on real time measurements. This is a simple load adjustment which does not address adjacent channel power performance.

In addition, the closed loop impedance control systems of the prior art do not provide for the best impedances for all variations of operating frequency and output power. This is because the algorithm to control the VVC circuit is rather simple in that a simple up direction or down direction is fed to the VVC circuit based on an output power detection. Part to part variations of the power amplifier circuitry used in each radiotelephone may also reduce the efficiency of the power amplifier.

Accordingly, there is a need for power amplifier load adjust system with more accurate and comprehensive control of the impedances presented to the power amplifier output by the variable impedance network. There is a further need for the load adjust system to compensate for part to part variations. There is a further need to control the variable impedance network in a manner that controls the adjacent channel power transmitted by the power amplifier.

DETAILED DESCRIPTION OF THE PREFERRED EMBODIMENTS

Figure 1:
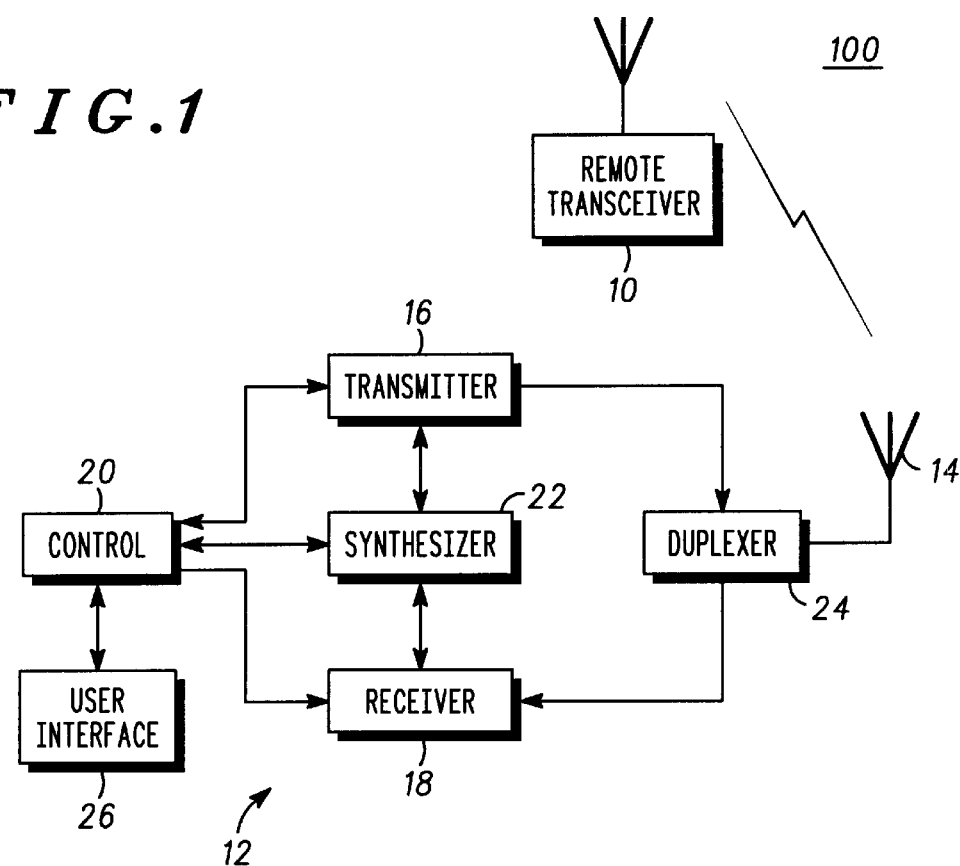
FIG. 1 is a block diagram of a radiotelephone having a receiver and a transmitter.

FIG. 1 is an illustration in block diagram form of a radiotelephone communication system 100. The radiotelephone communication system 100 includes a remote transceiver 10 and one or more radiotelephones such as radiotelephone 12. The remote transceiver 10 sends and receives RF signals to and from the radiotelephone 12 within a designated geographic area.

The radiotelephone 12 includes an antenna 14, a transmitter 16, a receiver 18, a control block 20, a synthesizer 22, a duplexer 24, and a user interface 26. To receive information, the radiotelephone 12 detects RF signals containing data through the antenna 14 and produces detected RF signals. The receiver 18 converts the detected RF signals into electrical baseband signals, demodulates the electrical baseband signals, recovers the data, including automatic frequency control information, and outputs the data to the control block 20. The control block 20 formats the data into recognizable voice or data information for use by the user interface 26.

Typically the user interface 26 includes a microphone, a speaker, a display, and a keypad. The user interface 26 is for receiving user input information and presenting received data that was transmitted by remote transceiver 10. The receiver 18 includes circuitry such as low noise amplifiers, filters, down conversion mixers and quadrature mixers, and automatic gain control circuitry, all known in the art.

To transmit RF signals containing information from the radiotelephone 12 to the remote transceiver 10, the user interface 26 directs user input data to the control block 20. The control block 20 typically includes any of a DSP core, a microcontroller core, memory, clock generation circuitry, software, and an output power control circuit. The control block 20 formats the information obtained from the user interface 26 and conveys it to the transmitter 16 for conversion into RF modulated signals. The transmitter 16 conveys the RF modulated signals to the antenna 14 for transmission to the remote transceiver 10. Thus, the transmitter 16 is for transmitting a modulated information signal. The duplexer provides isolation between the signals transmitted by the transmitter 16 and received by the receiver 18.

The radiotelephone 12 is operable over a predetermined band of frequencies. The synthesizer 22 provides the receiver 18 and the transmitter 16 with signals, tuned to the proper frequency, to allow the reception and transmission of information signals. Control over functions of the receiver 18 and the transmitter 16, such as channel frequency, is provided by the control block 20. Thus, the control block 20 provides the synthesizer 22 program instructions for frequency synthesis.

Figure 2:
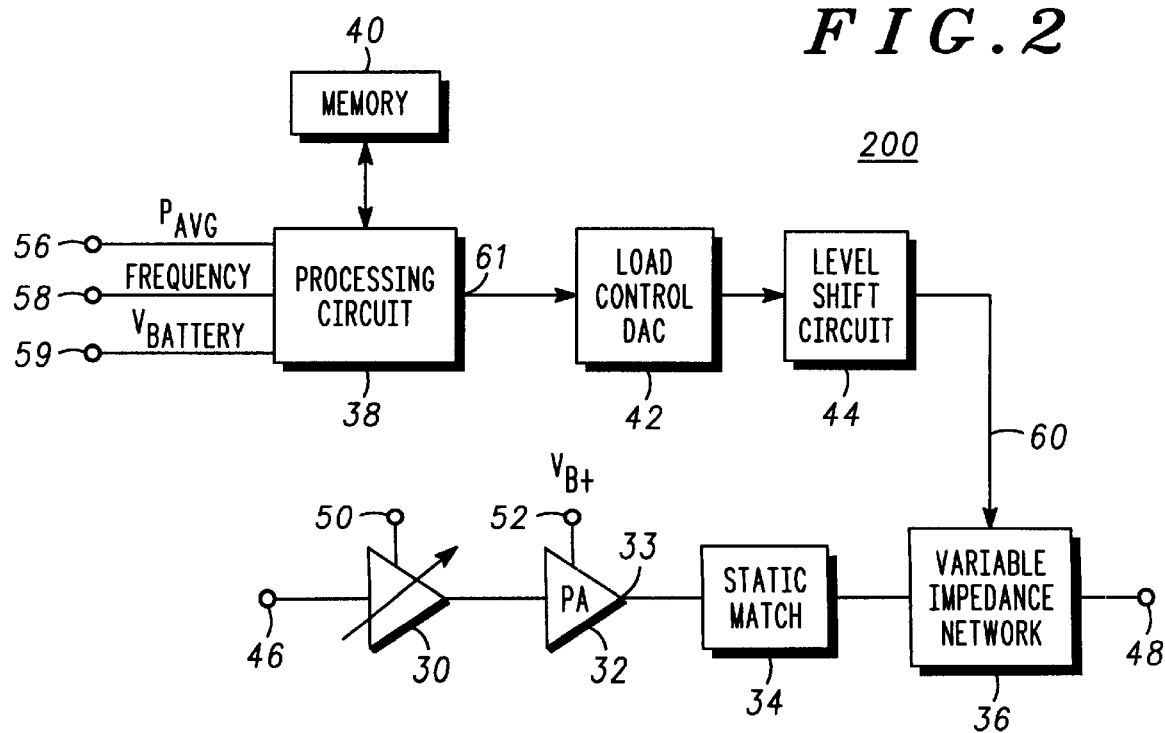
FIG. 2 is a power amplifier load adjust system that forms a portion of the transmitter of FIG. 1.

FIG. 2 is a power amplifier (PA) active load adjust system 200 that forms a portion of the transmitter 16 of FIG. 1. The load adjust system 200 includes a variable gain element, here variable gain amplifier 30, coupled to a power amplifier 32. A variable impedance network 36 is coupled to the output 33 of the power amplifier 32. Optionally, a static match circuit 34 can be inserted between the power amplifier 32 and the variable impedance network 36. This static match can comprise various RF matching circuitry as is known in the art to provide an intermediate impedance transformation at the output 33 of the power amplifier 32. This can be used, for example, to raise the impedance level from output 33 of the power amplifier 32 so as to reduce the effects of the quality factor of the variable impedance network 36.

A processing circuit 38 is coupled to a load control digital-to-analog converter (DAC) 42, and the load control DAC 42 is coupled to a level shift circuit 44. The level shift circuit 44 is coupled to the variable impedance network 36.

The control block 20 (FIG. 1) contains an output power control circuit (not shown) for generating an automatic output control (AOC) signal, also referred to as a transmit power command, as is known in the art. The AOC signal is applied to the VGA control input 50 to set the gain of the VGA 30. By varying the gain of the VGA 30, the radiotelephone 12 can vary its average transmitted output power (and thus the average amplitude of the modulated signal).

In an alternative embodiment, the VGA 30 is a multi-stage variable gain amplifier so that several stages of gain can be altered. The multiple stages of variable gain amplification can also be distributed along different portions of the transmit path. Further, at least some of the necessary variable gain can be achieved through the use of a variable attenuator rather than a variable gain amplifier as is know in the art.

The control block 20 can generate the AOC signal in response to radiotelephone 12 making received signal strength measurements. The remote transceiver 10 can also send the radiotelephone 12 a power control command, and the control block 20 generates the AOC signal at least in part responsive to the remote transceiver 12 power control command.

For linear modulation schemes, an RF modulated signal having an AM envelope is applied to VGA input 46. The AOC signal present at VGA control input 50 will cause the VGA gain to be set to a certain value. The RF signal produced by the VGA 30 is coupled to the power amplifier 32 as a power amplifier input signal. The power amplifier 32 produces an amplified version of the power amplifier input signal at power amplifier output 33.

The variable impedance network 36 provides a variable load impedance to the power amplifier output 33 to alter the load line of the power amplifier 118. This increases the overall efficiency of the power amplifier 118 and results in power savings. For each frequency of operation and output power, the variable impedance network 36 presents one of a plurality of impedances to the power amplifier output 33 responsive to a load control signal present on line 60.

The processing circuit 38 is a calculation circuit and can be realized with, for example, a DSP, a microprocessor, or an application specific integrated circuit (ASIC). The transmit power command generated by the control block 20 (FIG. 1), designated $P_{AVG}$ in FIG. 2, is applied to power level input 56. The average power level signal contains information as to the desired transmit power level. In addition, the control block 20 (FIG. 1) generates a channel frequency command to instruct the synthesizer 22 (FIG. 1) as to the radiotelephone 12 channel of operation. The channel frequency command is also applied to the processing circuit 38 though frequency command input 58.

The memory 40 is for storing a plurality of control values as a function of power amplifier output power and frequency of operation. The memory 40 thus contains information in the form of a look-up table. The processing circuit 38 is coupled to the variable impedance network 36, the control block 20 (FIG. 1), and the memory 40. The processing circuit retrieves a plurality of control values stored in the memory 40 and uses the plurality of control values to generate the load control signal in response to the radiotelephone 12 transmit power command and in response to the channel frequency command.

For a particular output power level and frequency of operation, there exists an optimum power amplifier load impedance that causes the power amplifier 32 to have the highest efficiency. In addition, there are impedances that cause the power amplifier 32 to produce less than a certain amount of adjacent channel output power. When the transmit power level is changed by varying the gain of the VGA 30, a different optimum impedance must be presented to the power amplifier output 33. Thus, the processing circuit 38 must produce a load control signal on line 60 responsive to the desired transmit power level and the frequency of operation.

The processing circuit 38 thus retrieves the plurality of control values stored in the memory 40 and uses the plurality of control values to generate a digital load control signal at processing circuit output 61. The load control DAC 42 coupled to the processing circuit 42 and the variable impedance network 36 converts the digital load control signal to the load control signal.

In the illustrated embodiment, a level shift circuit 44 is inserted between the load control DAC 42 and the variable impedance network 36. The level shift circuit 44 is for converting the analog signal produced by the load control DAC 42 into a signal level necessary for operating the variable impedance network. For example, the voltage range for the signal produced at the output of the load control DAC 42 might be 0–3 Volts. For maximum dynamic range, the variable impedance network 36 might need a control voltage within the range of −1.5 volts to +1.5 volts. The level shift circuit thus converts load control DAC 42 analog signal to the load control signal on line 60.

A set of equations that the processing circuit 38 uses to generate the digital control word is given in Table 1. Table 1 has a column for transmit output powers, a column for supply voltage, and a column for the digital load control word (e.g. resulting load control DAC setting). In the illustrated embodiment, the radiotelephone 12 can transmit at power levels ranging from maximum output power down to below 20 dBm. The maximum output power corresponds to the maximum output power that a given radiotelephone can deliver. The minimum transmit power is around −10 dBm, but the radiotelephone in actual use typically transmits above 8 dBm. Other sets of transmit power levels can be used.

TABLE 1

| Output Power (dBm) | Supply Voltage ($V_{B+}$) | Digital Load Control (e.g.input to DAC) |
|---|---|---|
| max | Don't Care | 0 |
| 28–20 | >=3.6 V | XF + XP + XB0* ($V_{B+}$ − 3.6 V)/0.2) (1) |
| 28–20 | <3.6 V | XF + XP − XB0* (3.6 V − $V_{B+}$)/0.2) (2) |
| <20 | Don't Care | 255 |

The second column of supply voltage is an optional feature and will be addressed later. The third column corresponds to the digital load control for the load control DAC 42 (FIG. 2). In the illustrated embodiment, the digital control word is an eight bit word for controlling the load control DAC 42. Thus, the load control DAC 42 has 256 states and can generate 256 different values for the load control signals.

Table 1 shows that for the highest power level, maximum power, the digital load control has a value of 0. This means that the DAC will output an analog voltage corresponding to DAC state 0. This can be slightly above 0 volts, or approximately 0.1 V. Table 1 also shows that for the lowest power levels the digital load control word has a value of 255 corresponding to DAC state 255. The load control DAC 42 output level at state 255 can be, for example, approximately 3 volts.

For output powers below 20 dBm, only a single digital load control word is assigned because the dynamic range of the variable impedance network 36 has been exceeded at these power levels. The variable impedance network 36 presents various impedances to the power amplifier 32 responsive to the load control signal. The impedances can correspond to a certain output power, maximum power amplifier efficiency at particular frequencies and output powers, and/or minimum adjacent channel power when the power amplifier is producing a certain output power at particular frequencies. The variable impedance network may not have enough range to present the optimum impedance to the power amplifier at all of the various frequencies and output powers. For example, if voltage variable capacitors (VVCs) are used in the variable impedance network 36, the variable capacitance range of a voltage variable capacitor is limited. Therefore, when the range of the variable impedance network 36 is exceeded, DAC state 255 is used to produce the load control signal.

For output powers between 28 dBm and 20 dBm, Table 1 shows that an equation is used to develop the digital load control. For simplicity, the optional supply voltage parameter is initially ignored so that only equation (1) is needed. Equation (1) has several control values that must be recalled from the memory 40 to produce the digital load control word. The control values include values for XF, XP, and XB0. In equation (1), XF and XP are variables, while XB0 is a constant.

The control values stored in the memory 40 must be determined and then stored in the memory before the radiotelephone 12 is shipped from the factory. The derivation of the control values is generally a multi-step process. An explanation follows on how to derive the control values. This explanation will also help explain what the control values are and how they are used.

For any radiotelephone, a power amplifier design is developed around a chosen power amplifier semiconductor device. For example, the device might be a bipolar device, a field-effect device (FET), or a heterojunction device. Once the design is developed, the power amplifier design is characterized over output power and frequency in conjunction with the variable impedance network 36.

A first step in the characterization is a headroom phasing procedure. This characterization involves using the load adjust system 200 of FIG. 2 without the memory 40 and the processing circuit 38 (this may be referred to as a test load adjust system). A fixed load is attached to the system output 48 (e.g. 50$^\Omega$), and the VGA 30 is set to produce a predetermined output power. In the illustrated embodiment, the predetermined output power is 28 dBm. Thus, the AOC signal applied to the VGA control input 50 is set to 28 dBm.

The test load adjust system is then characterized over a plurality of frequencies within the predetermined band of frequencies. In the illustrated embodiment, the transmit frequency band is 824 MHz to 849 MHz, and the plurality of frequencies comprise six equally spaced frequencies. Thus, the six test frequencies are 824 MHz (frequency 1), 829 MHz (frequency 2), 834 MHz (frequency 3), 839 MHz (frequency 4), and 844 MHz (frequency 5), and 849 MHz (frequency 6). Other divisions of a frequency and can be envisioned without the use of the inventive faculty.

At 824 MHz, the input to the load control DAC 42 is varied until the output power is 28 dBm and the power amplifier efficiency is maximized. This input is referred to as the test $XF_1$ value. The same thing is done for each of the other five frequencies to produce five other XF test values. This step is referred to as headroom phasing because it reduces the amount of variability in the power amplifier saturation level due to output insertion loss variations over frequency. With the completion of this step, six test XF values are produced. Table 2 is an example of experimentally determined test XF control values at the 28 dBm output power for a given power amplifier design.

TABLE 2

| Output Power (dBm) | Frequency (MHz) | test XF Number | Load Control DAC Input (e.g. test XF value) |
|---|---|---|---|
| 28 | 824 (f1) | XF1 | 50 |
| 28 | 829 (f2) | XF2 | 65 |
| 28 | 834 (f3) | XF3 | 52 |
| 28 | 839 (f4) | XF4 | 45 |
| 28 | 844 (f5) | XF5 | 43 |
| 28 | 849 (f6) | XF6 | 50 |

The XF values determined at this step are referred to as the test XF control values because they are used only to determine the XP control values. Once the XP control values are determined for a power amplifier/radiotelephone design, new XF values will be found and stored in the memory 40 for each radiotelephone 12 during the factory phasing stage of production.

After finding the test XF control values, the next step is to determine the offsets corresponding to the XP control values. The XP control values are those offset values necessary to produce the best efficiency and/or adjacent channel power performance at a plurality of power levels lower than 28 dBm. In the illustrated embodiment, the load adjust system is characterized over an additional 3 output powers to obtain the XP control values.

The first additional output power is 26 dBm. The XP value determined for this power level is referred to as XP2 (XP1 has a value of 0, which will be explained shortly). Thus, using the test load adjust system, the AOC signal applied to the VGA control input 50 is set to 26 dBm, and the VGA 30 gain is adjusted accordingly. The digital control word (e.g. input to the load control DAC 42) is varied; the output power and either the power amplifier 32 efficiency, the transmitted adjacent channel power, or both are monitored. Thus, the output is maintained at 26 dBm over the plurality of frequencies, and either efficiency, adjacent channel power, or both are optimized.

The XP2 control value generated at this step is a single offset value that will be used for each of the plurality of frequencies. In other words, this procedure will yield an offset value for 26 dBm operation that is added to each of the test XF values that were determined at the 28 dBm output setting.

For any of the plurality of frequencies and at 26 dBm operation, the XP2 value will be added to the corresponding XF value. Thus, at frequency 1 (890 MHz), the digital control word at 28 dBm is 50. If the value of XP2 is found to be 30, then the digital control word at 26 dBm and frequency 1 is 80. Similarly, at frequency 2 the digital control word is 65, so the digital control word at frequency 2 and 26 dBm is 95.

For the 28 dBm output power setting, the digital control word was individually determined for each of the plurality of frequencies and stored as an XF value. Therefore, the 28 dBm setting is the reference point for which all other power level DAC settings will be offset from. Accordingly, for power level 28 dBm, there is no XP offset value, and XP1=0.

The offset control value used for the 26 dBm setting is referred to as XP2. A similar procedure is followed to determine an XP3 control value corresponding to an output power of 24 dBm. Table 3 shows the test XF, XP, and ultimate digital control word values for several output powers at each of the plurality of frequencies.

The XP control values are stored in the memory 40 for each radiotelephone 12. However, new XF control values are generated for each particular radiotelephone 12 at the factory. This is referred to as XF factory phasing. Thus, the factory phasing is done for each radiotelephone 12 to determine the new XF values at 28 dBm. These new XF values are then stored in the memory 40. Each radiotelephone is individually phased at the factory to have its own, unique set of XF control values. Conversely, the XP control values for every radiotelephone of a given radiotelephone design are the same. The test XF values shown in Table 3 could be the actual XF values stored in the memory 40 of the radiotelephone 12 as it is shipped from the factory.

Figure 3:
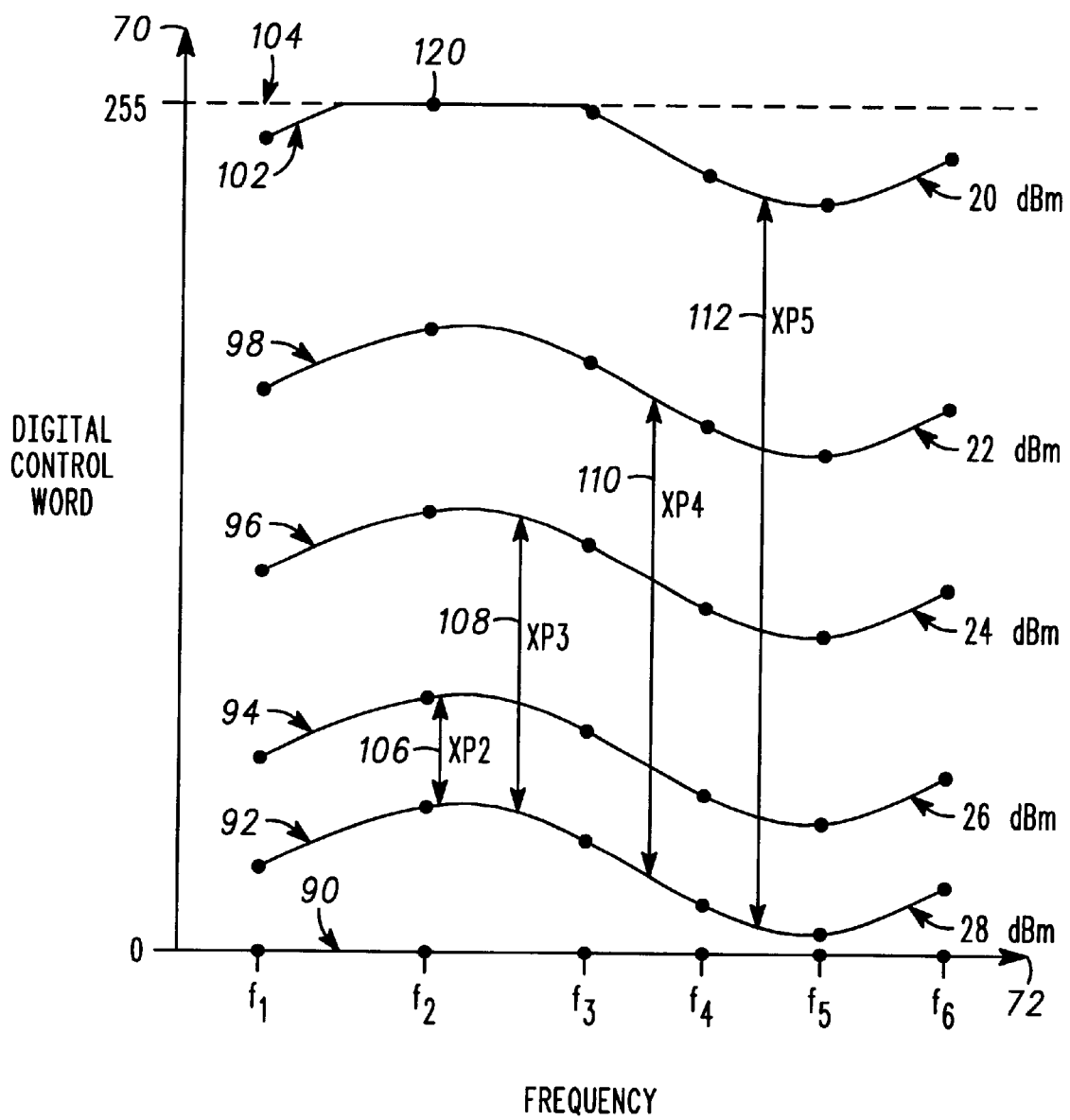
FIG. 3 is a graphical representation of the digital control word versus frequency for a plurality of power levels, the digital control word for controlling the load adjust system of FIG. 2.

FIG. 3 is a graphical representation of the digital control word (on digital control axis 70) versus frequency (on frequency axis 72) for a plurality of power levels. When the radiotelephone 12 is required to transmit maximum available power, the digital control word is 0 for all frequencies. Thus, the maximum power word curve 90 has a value of zero for all frequencies.

When the radiotelephone 12 is set to transmit 28 dBm, one of the XF values stored in the memory 40 is used as the digital control word; these values fall on the 28 dBm word curve 92. When the radiotelephone 12 is set to transmit 26 dBm, the whole 28 dBm word curve 92 is offset by the XP2 offset control value 106 to form the 26 dBm word curve 94. Thus, the processing circuit 38 (FIG. 2) calculates the digital control word using an equation, so that a value falling on the 26 dBm word curve 94 is produced as the digital control word.

When the radiotelephone 12 is set to transmit 24 dBm, the whole 28 dBm word curve 92 is offset by the XP3 offset control value 108 to form the 24 dBm word curve 96. Thus, the processing circuit 38 (FIG. 2) calculates the digital control word using an equation so that a value falling on the 24 dBm word curve 96 is produced as the digital control word.

When the radiotelephone 12 is set to transmit 22 dBm, the whole 28 dBm word curve 92 is offset by the XP4 offset control value 110 to form the 22 dBm word curve 98. Thus, the processing circuit 38 (FIG. 2) calculates the digital control word using an equation so that a value falling on the 22 dBm word curve 98 is produced as the digital control word.

When the radiotelephone 12 is set to transmit 20 dBm, the whole 28 dBm word curve 92 is offset by the XP5 offset control value 112 to form the 20 dBm word curve 102. Thus, the processing circuit 38 (FIG. 2) calculates the digital control word using an equation so that a value falling on the 20 dBm word curve 102 is produced as the digital control word. Note, however, that at the 20 dBm power setting, the dynamic range of the variable impedance network 36 is beginning to be reached. This can be seen by the calculated control word 120 corresponding to frequency f2 on the 20 dBm word curve 102. The last load control DAC 42 state is 255, which corresponds to substantially the last impedance value that can be tuned to using the variable impedance network 36 (FIG. 2). In addition, for power level settings below 20 dBm, the minimum power word curve 104 is used for all frequencies.

TABLE 3

| $P_{OUT}$ (dBm) | Frequency | Test XF Number | Test XF Value | XP Number | XP Value | Digital Control Word |
|---|---|---|---|---|---|---|
| Max. | Any | — | — | — | — | 0 |
| 28 | f1 | XF1 | 50 | XP1 | 0 | 50 |
| 28 | f2 | XF2 | 65 | XP1 | 0 | 65 |
| 28 | f3 | XF3 | 52 | XP1 | 0 | 52 |
| 28 | f4 | XF4 | 45 | XP1 | 0 | 45 |
| 28 | f5 | XF5 | 43 | XP1 | 0 | 43 |
| 28 | f6 | XF6 | 50 | XP1 | 0 | 50 |
| 26 | f1 | — | — | XP2 | 30 | 80 |
| 26 | f2 | — | — | XP2 | 30 | 95 |
| 26 | f3 | — | — | XP2 | 30 | 82 |
| 26 | f4 | — | — | XP2 | 30 | 75 |
| 26 | f5 | — | — | XP2 | 30 | 73 |
| 26 | f6 | — | — | XP2 | 30 | 80 |
| 24 | f1 | — | — | XP3 | 90 | 140 |
| 24 | f2 | — | — | XP3 | 90 | 155 |
| 24 | f3 | — | — | XP3 | 90 | 142 |
| 24 | f4 | — | — | XP3 | 90 | 135 |
| 24 | f5 | — | — | XP3 | 90 | 133 |
| 24 | f6 | — | — | XP3 | 90 | 140 |
| 22 | f1 | — | — | XP4 | 140 | 190 |
| 22 | f2 | — | — | XP4 | 140 | 205 |
| 22 | f3 | — | — | XP4 | 140 | 192 |
| 22 | f4 | — | — | XP4 | 140 | 185 |
| 22 | f5 | — | — | XP4 | 140 | 183 |
| 22 | f6 | — | — | XP4 | 140 | 190 |
| 20 | f1 | — | — | XP5 | 200 | 250 |
| 20 | f2 | — | — | XP5 | 200 | 265 |
| 20 | f3 | — | — | XP5 | 200 | 252 |
| 20 | f4 | — | — | XP5 | 200 | 245 |
| 20 | f5 | — | — | XP5 | 200 | 243 |
| 20 | f6 | — | — | XP5 | 200 | 250 |
| <20 | Any | — | — | — | — | 255 |

The processing circuit 38 can use other parameters to calculate the digital control or example, variations in the supply voltage can be compensated for by the variable impedance network 36. For example, a voltage monitoring circuit (not shown) coupled to the processing circuit 38 (FIG. 2) can detect a voltage of the battery (not shown) used to power the radiotelephone 12 (FIG. 1) as is known in the art.

The voltage monitoring circuit generates an indication of the voltage referred to as a voltage level signal. The voltage level signal is applied to voltage port 59 (FIG. 2) and the processing circuit 38 generates the digital control word responsive to the voltage level signal.

Figure 4:
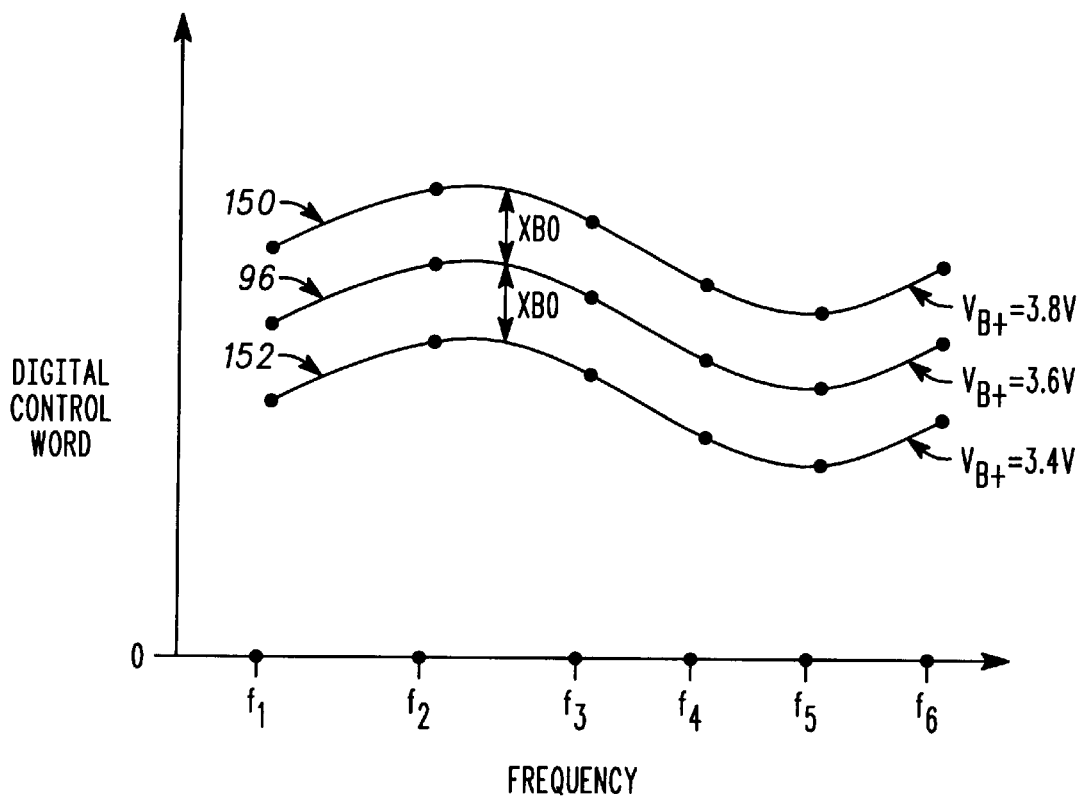
FIG. 4 is a plot of the digital control word as a function of frequency and supply voltage.

Table 1 shows that the processing circuit 38 actually uses two equations for power level settings between 28 and 20 dBm. Equation (1) is used when the supply voltage on supply port 52 is above 3.6 volts, and equation (2) is used when the supply voltage is below 3.6 volts. The control value XB0 is a predetermined constant representing an additional offset value for the digital word curves. FIG. 4 is a graphical representation of the 24 dBm digital word curve 96 versus frequency for three different supply values. This example is for an XB0 control value constant of 5. When the supply voltage is 3.6 volts, the nominal 24 dBm digital word curve 96 is plotted. When the supply voltage at supply port 52 (FIG. 2) is 3.8 V, equation (1) from Table 1 yields an additional offset of 5 (since XB0 is 5). Thus, the whole 24 dBm digital word curve 96 is moved up to form the 3.8 V–28 dBm digital word curve 150. Similarly, when the supply voltage at supply port 52 (FIG. 2) is 3.4 V, equation (2) from Table 1 yields an additional offset of 5 (since XB0 is 5). Thus, the whole 24 dBm digital word curve 96 is moved down to form the 3.4 V–28 dBm digital word curve 152.

Thus, when the supply voltage moves up (e.g. greater than 3.6 volts), the power amplifier 32 operating point moves away from saturation and thus becomes less efficient. By increasing the load impedance presented to the power amplifier 32 (e.g. by raising the digital word curve), the power amplifier 32 moves back closer to saturation. Conversely, if the supply voltage decreases, the power amplifier 32 becomes too saturated. By decreasing the power amplifier 32 load impedance (e.g. by lowering the digital word curve), the power amplifier 32 moves back away from being too saturated.

Accordingly, the minimum digital control word of 0 corresponds to an analog voltage at the output of the load control DAC 42 that is close to 0 volts. The maximum digital control word of 255 corresponds to an analog voltage at the output of the load control DAC 42 that is close to 3 volts.

The level shift circuit changes the analog voltage range. The minimum analog voltage of 0 volts from the load control DAC 42 is converted by the level shift circuit 44 (FIG. 2) to –1.5 V. The maximum analog voltage of 3 volts from the load control DAC 42 is converted by the level shift circuit 44 to +1.5 volts.

The variable impedance network 36 is configured so that a load control signal of –1.5 volts corresponds to the variable impedance network 36 presenting the maximum available load impedance to the power amplifier 32 (e.g. DAC state of 255 corresponds to maximum load impedance). A load control signal of +1.5 volts corresponds to the variable impedance network 36 presenting the minimum available load impedance to the power amplifier 32 (e.g. DAC state of 0 corresponds to minimum load impedance).

It is the processing circuit 38 that retrieves the control values from the memory 40 and uses the equations to generate the digital control word, which ultimately results in the load control signal after conversion to an analog signal and after level shifting by the level shift circuit 44. For battery voltages that yield an non-integer additional battery offset, the offset is rounded to the nearest integer value. Additional parameters, such as temperature, could be built into the equations used by the processing circuit 38.

In the illustrated embodiment, six frequencies within the frequency band are defined—f1 through f6. These frequencies designate frequency divisions. For operating frequencies other than the six designated frequencies, a control word corresponding to one of the six designated frequencies is used. For example, frequency 1 is designated as 824 MHz, and frequency 2 is designated as 829 MHz. For all operating frequencies between 824 and 826.5 MHz, the digital control word corresponding to f1 is used. For all operating frequencies between 826.5 MHz and 831.5 MHz, the digital control word corresponding to f2 is used. Thus, frequency spans of plus/minus 2.5 MHz are formed about the designated frequencies to define which control word to use. Frequency 1 only has a plus 2.5 MHz span, and frequency 6 only has a minus 2.5 MHz span.

Figure 5:
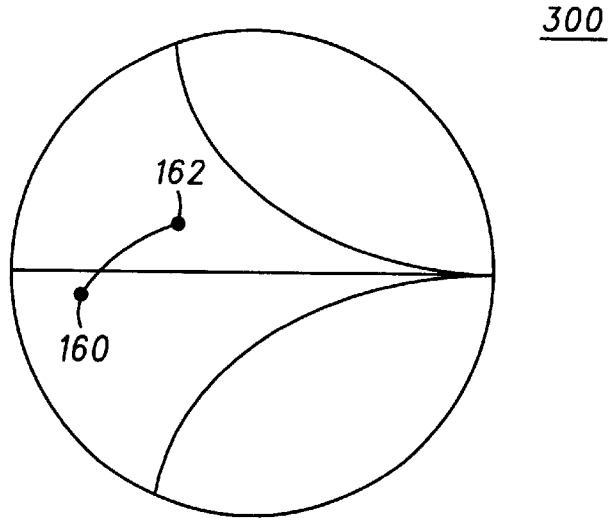
FIG. 5 is a Smith Chart showing how the impedance of the variable impedance network used in the load adjust system varies as a function of the digital control word.

FIG. 5 shows a Smith Chart with different load impedances to show how the load impedance of the variable impedance network 36 varies as a function of the digital control word. For a digital control word of 0 (corresponding to a load control signal of +1.5 V), minimum load impedance 160 results. Conversely, for a digital control word of 255 (corresponding to a load control signal of −1.5 V), maximum load impedance state 162 results.

Figure 6:
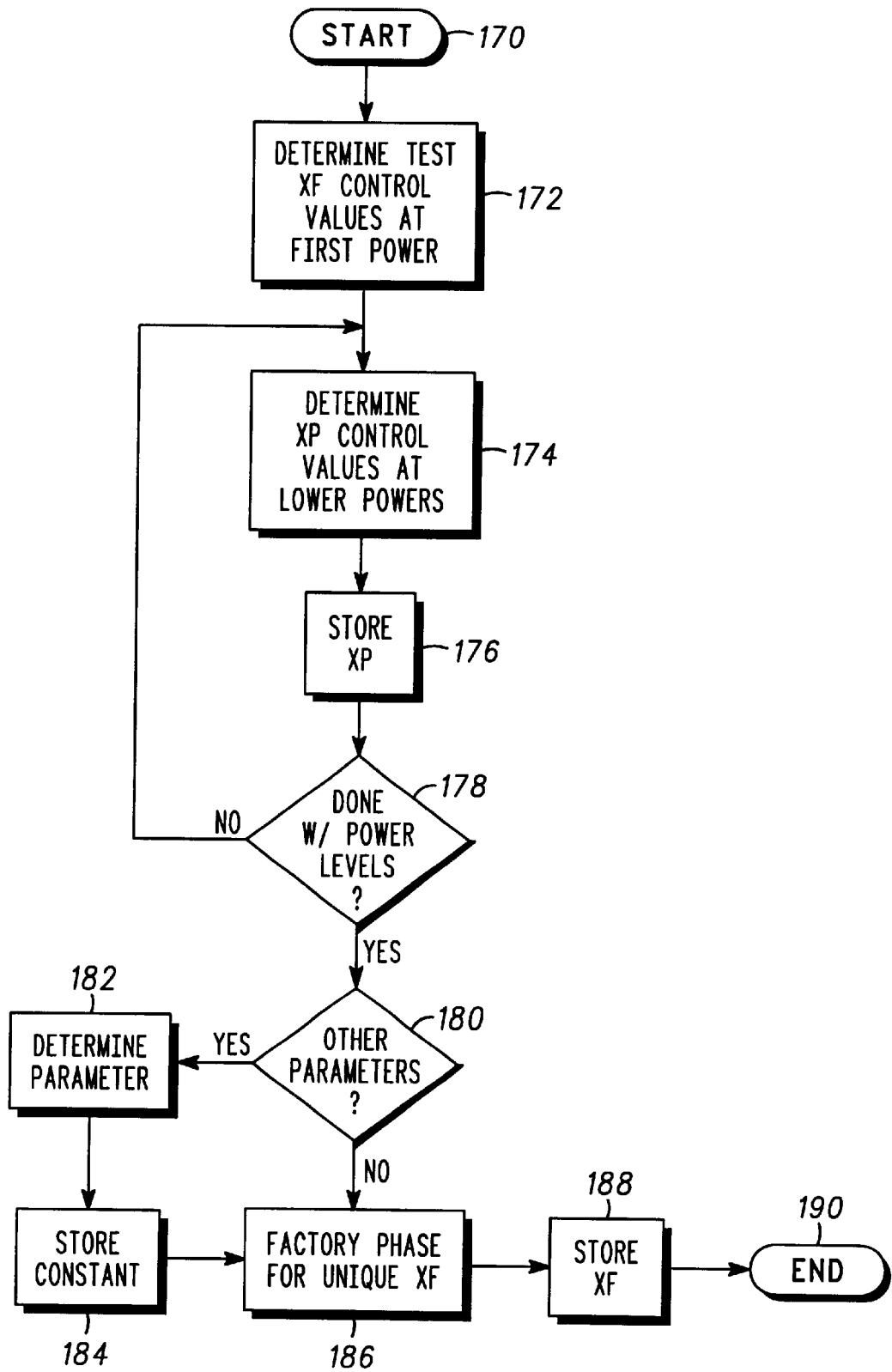
FIG. 6 is a flowchart of a method of determining the various control values stored in the memory of the load adjust system of FIG. 2.

FIG. 6 is a flowchart of a method of determining the various control values stored in the memory 40 (FIG. 2). The method starts at block 170, and at block 172, the test XF values are determined. These are the intermediate XF control values that are found initially so that the XP values can be determined. This step of determining the test XF values occurs at a first output power level (here 28 dBm). The method continues at block 174 where the XP control values are determined. These are the offset values for power levels lower than 28 dBm. Once the XP values are determined, they are stored in the memory 40 (FIG. 2) at block 176. At decision block 178, it is determined as to whether all of the power levels have been tested to generate the necessary XP values. If not, the method continues back at block 174.

If all XP power levels have been tested, it is determined at decision block 180 as to whether other parameters, such as a supply voltage offset constant is desired. If a battery voltage offset constant is desired, then the XB0 battery offset constant is determined at block 182. This XB0 constant is stored in the memory 40 (FIG. 2) at block 184. If no other parameters are desired, the method progresses from decision block 180 to block 186.

At block 186, the factory phasing procedure is performed to determine the new XF control values unique to each radiotelephone. This phasing is independently performed for each radiotelephone. The new, unique XF values for each radiotelephone is stored in the respective memory of each radiotelephone at block 188. The method ends at block 190.

Figure 7:
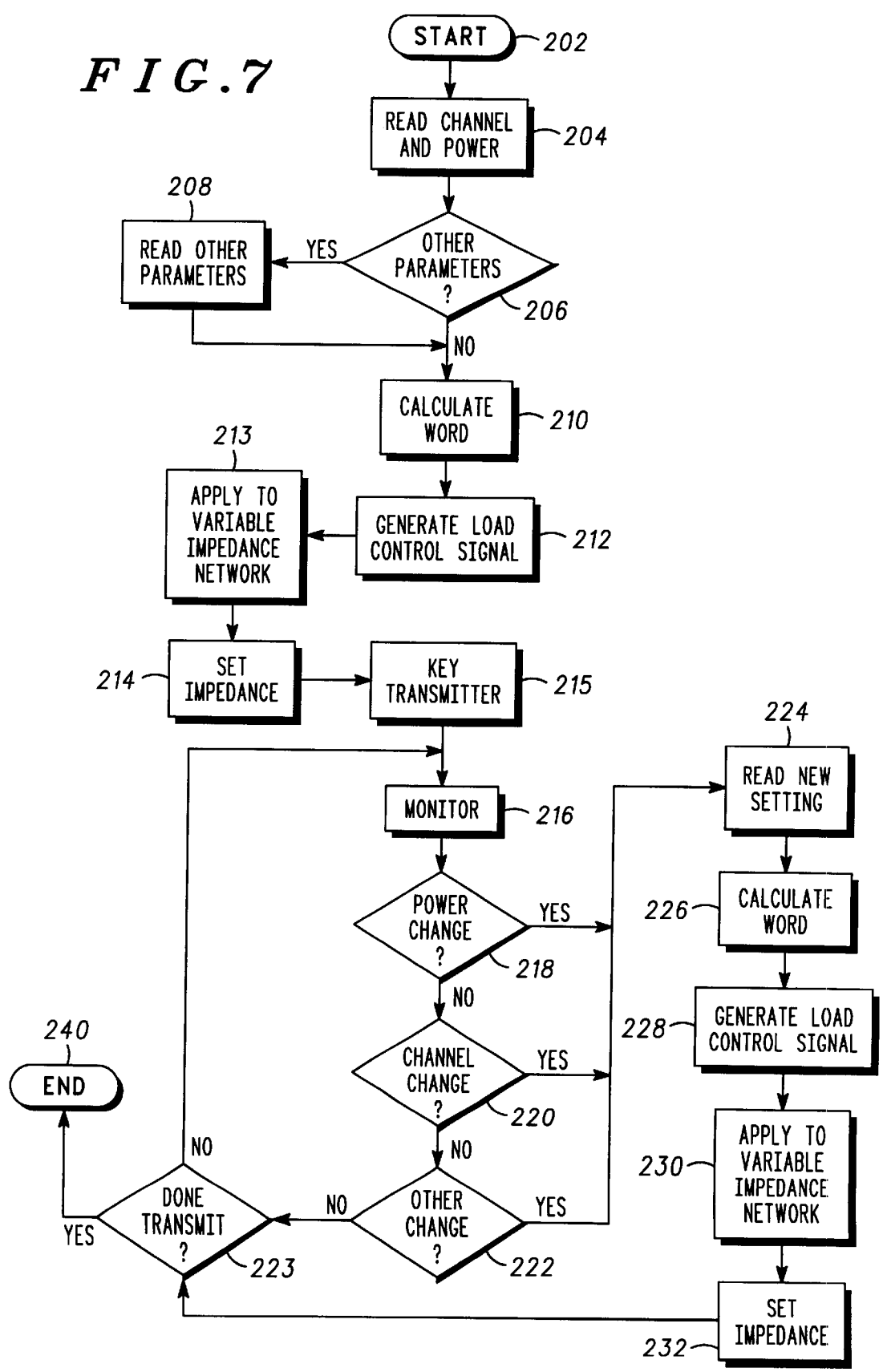
FIG. 7 is a flowchart of a method of controlling the variable impedance network of the load adjust system in FIG. 2.

A method of controlling the variable impedance network 36 at the output 33 of the power amplifier 32 operable in the radiotelephone 12 over a plurality of frequencies within a predetermined band of frequencies is shown in FIG. 7. The method begins at block 202, and at block 204 the processing unit 38 (FIG. 2) receives an indication of channel of operation and an indication of desired output power. If at decision block 206 it is desired to read other parameters such as batter voltage offset, then at block 208 the other parameter is received.

The method continues at block 210 where the processing unit retrieves stored control values (also referred to as control values) from the memory 40 (FIG. 2). Also at block 210, the processing unit either generates the digital control word directly from a stored control value, or the processing unit calculates the digital control word using the stored control values. In an alternate embodiment, all necessary digital control values are stored so that they can be retrieved directly from memory without the need for any calculation.

At block 212 the load control DAC 42 (FIG. 2) and the level shift circuit 44 (FIG. 2) produce the load control signal using the control values and in response to the indication of channel of operation and the indication of the desired output power. At block 213, the load control signal is applied to the variable impedance network 36 (FIG. 2), and at block 214 the variable impedance network 36 sets an impedance to present to the output 33 of the power amplifier 32 (FIG. 2) in response to the load control signal. The transmitter 16 (FIG. 1) is activated to transmit at block 215.

At block 215 the processing unit 38 (FIG. 2) constantly monitors the control signals to determine if there is a power level change at decision block 218 or a channel change at decision block 220. If there is no change, it is determined at decision block 222 whether any other parameters, such as supply voltage, that are being monitored have changed. If there are no changes and the transmitter 16 (FIG. 1) is not done transmitting at decision block 223, the method continues at block 216. If at decision block 223 the transmitter 16 (FIG. 1) is done transmitting, the transmitter 16 is de-activated and the method ends at block 240.

If the transmit power, channel, or other parameter changes, the processing circuit 38 (FIG. 2) reads the new setting at block 224. The new digital control word is calculated at block 226. The new load control signal is generated at block 228 and applied to the variable impedance network 36 (FIG. 2) at block 230. The variable impedance network 36 sets a new load impedance at block 232.

If at decision block 223 the transmitter 16 (FIG. 1) is not done transmitting, the method continues at block 216. If the transmitter 16 is done transmitting, the method ends at block 240.

Figure 8:
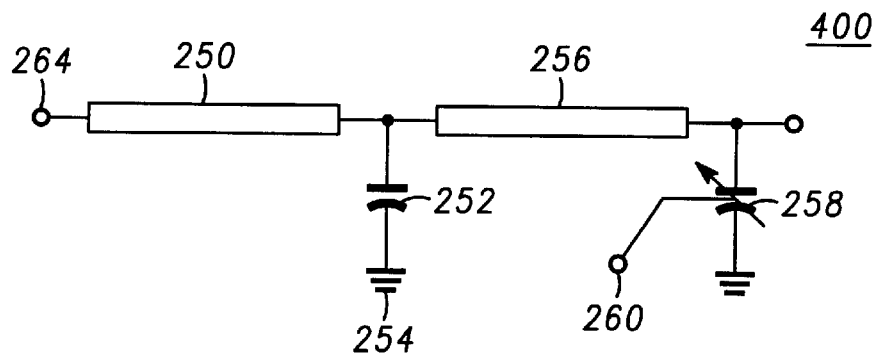
FIG. 8 shows a variable impedance network that can be used to present various impedances to the power amplifier of the load adjust system of FIG. 2.

FIG. 8 shows a first embodiment variable impedance network 400 that can be used to present various impedances to the power amplifier 32 (FIG. 2). The variable impedance network 400 includes first transmission line 250, fixed shunt capacitor 252 coupled to ground potential 254, second transmission line 256, and at least one variable element 258 coupled to ground potential 254. The variable element 258 can be selected from the group consisting of a varactor diode and a voltage variable capacitor (VVC).

The VVC is disclosed in U.S. Pat. No. 5,137,835, filed Oct. 15, 1991 by Kenneth D. Cornett, E. S. Ramakrishnan, Gary H. Shapiro, Raymond M. Caldwell, and Wei-Yean Howrig, the entire patent of which is incorporated herein by reference. However, any capacitor using a ferroelectric material which provides variable capacitance can be used. The VVC can comprise a pair of VVCs which are of opposite polarity to eliminate non-linearities during operation. The load control signal is applied to input 260 as a voltage to vary the capacitance of the variable element 258.

Other configurations of the variable impedance network 400 can be envisioned. For example, additional elements can be included, such as lumped element or distributed element inductors, additional transmission lines and capacitors, and additional variable elements.

Figure 9:
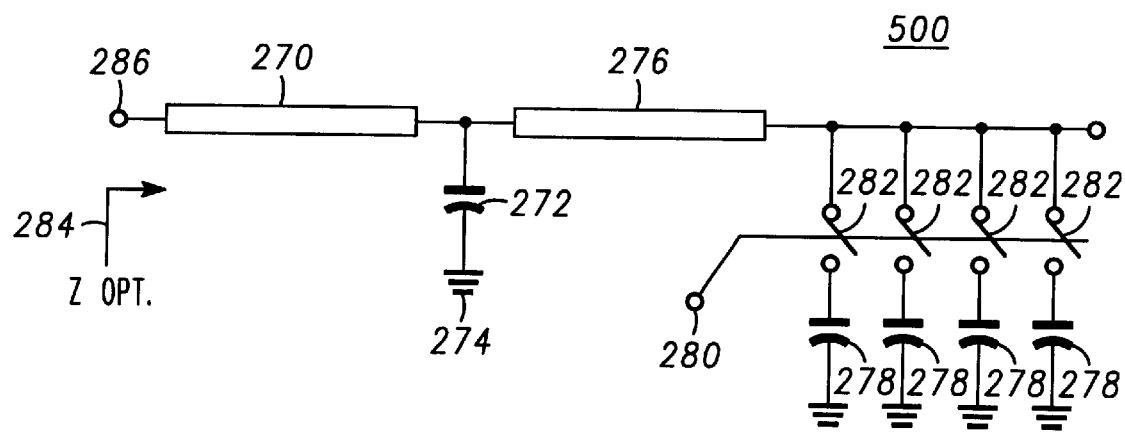
FIG. 9 shows a second embodiment variable impedance network.

FIG. 9 shows a second embodiment variable impedance network 500. The variable impedance network 500 includes first transmission line 270, a fixed shunt capacitor 272 coupled to ground potential 274, second transmission line 276, and a plurality of capacitors 278 coupled to ground that can be coupled and uncoupled the transmission line 276. The load control signal is applied to input 280 to open and close a plurality of switches 282 coupling the plurality of capacitors 278. The plurality of switches 282 can comprise, for example, PIN diodes or micro-electromechanical switches (MEMs). The plurality of capacitors 278 can be individually controlled.

Other configurations of the variable impedance network 602 can be envisioned without the use of the inventive faculty. For example, additional elements can be included, such as lumped element or distributed element inductors, additional transmission lines and capacitors, and additional variable elements. A combination of the variable impedance network 400 and the variable impedance network 500 could be used to increase the range of obtainable impedances. In addition, the load control signal can comprise multiple signals to separately control different variable impedance elements.

The factory phasing to generate the new XF control values for each radiotelephone helps tailor the variable impedance network 36 to each and every radiotelephone 12 that is shipped. Thus, the plurality of control values stored in the memory 40 (FIG. 2) correspond, at least in part, to amplifier load impedances that cause the power amplifier 32 (FIG. 2) to operate at substantially a predetermined output power over a plurality of frequencies within the predetermined band of frequencies when a predetermined input power is applied to the power amplifier.

The generation of the XF control values at the 28 dBm power level helps remove power amplifier 32 (FIG. 2) headroom that would otherwise be built in to compensate for worst case conditions. For example, the insertion loss of the static match circuit 34 (FIG. 2) varies across the band of frequencies. If the factory phasing were not performed, the power amplifier 32 would be biased to compensate for the worst insertion loss across the frequency band. At frequencies where the insertion loss is less than the worst case insertion loss, the power amplifier would no longer be at the most efficient operating point.

The additional XP offset values at a minimum can be used to increase the power amplifier efficiency for power levels lower than the power level corresponding to the XF power level. For example, for a constant envelope modulation scheme, the XF values can be offsets from the 28 dBm digital control word 92 (FIG. 3) to help increase maximum efficiency. Thus, the plurality of control values stored in the memory 40 (FIG. 2) can correspond, at least in part, to amplifier load impedances that cause the power amplifier 32 (FIG. 2) to have an efficiency greater than a predetermined amplifier efficiency over a plurality of frequencies within the predetermined band of frequencies.

In addition, for the case of a linear power amplifier used for linear modulation schemes, the control values can correspond to an output power as well as an adjacent channel power (ACP) that is less than a predetermined level of ACP. Thus, the plurality of control values stored in the memory can correspond, at least in part, to amplifier load impedances that cause the power amplifier 32 (FIG. 2) to operate at substantially a to predetermined output power and produce an adjacent channel power substantially less than a predetermined adjacent channel power when the power amplifier 32 (FIG. 2) operates over each of a plurality of frequencies within the predetermined band of frequencies. This results in operating the power amplifier 32 at a more efficient point.

Alternatively stated, a first set of the plurality of control values (referred to as the XF offset control values) stored in the memory 40 (FIG. 2) correspond to amplifier load impedances that cause the power amplifier 32 (FIG. 2) to operate at substantially a first output power and produce an adjacent channel power substantially less than a predetermined adjacent channel power when the power amplifier 32 operates over each of a plurality of frequencies within the predetermined band of frequencies.

Furthermore, a second set of the plurality of control values (referred to as the XP control values) stored in the memory 40 (FIG. 2) comprise offset control values used by the processing circuit to calculate the load control signal when the power amplifier 32 operates at a second output power. The processing circuit 38 (FIG. 2) calculates the load control signal to cause the variable impedance network 36 to present load impedances to the output 33 of the power amplifier 32, thereby causing the power amplifier 32 to have an efficiency greater than a predetermined amplifier efficiency over each of the plurality of frequencies within the predetermined band of frequencies.

The previous description of the preferred embodiments are provided to enable any person skilled in the art to use or make the power amplifier load adjust system. Various modifications to these embodiments will be readily apparent to those skilled in the art, and the generic principles defined herein may be applied to other embodiments without the use of the inventive faculty. For example, the load adjust system 200 (FIG. 2) can optionally include an isolator coupled to the output 48 of the variable impedance network 36. The isolator presents a substantially constant impedance to the output of the variable impedance network 36. This will provide extra predictability to the various impedances that the variable impedance network 36 provides to the power amplifier output 33.

The memory-based power amplifier load adjust system provides for a highly effective way of removing the operating point headroom that is typically designed into the power amplifier to handle worst case conditions and part to part variations. This provides for more efficient operation. In addition, storing and retrieving control values to calculate the load control signal in an open loop fashion provides an accurate and cost effective alternative to deriving the load control signal from power detection measurements in a closed loop system. This open loop load control based upon control values stored in memory allows for the operation of a power amplifier for both optimum efficiency and ACP performance over power and frequency. With the increased complexity of future generation radiotelephones, the power amplifier load adjust system used in a radiotelephone will provide a significant performance advantage over conventional radiotelephones.

We claim:

1. A power amplifier load adjust system for use in a radiotelephone, the radiotelephone operable over a predetermined band of frequencies and powered by a battery, the power amplifier load adjust system comprising:

a power amplifier having an input and an output;

a variable impedance network coupled to the output of the power amplifier, the variable impedance network presenting a plurality of impedances to the output of the power amplifier responsive to a load control signal;

a control circuit for generating a transmit power command and a channel frequency command;

a memory for storing a plurality of control values as a function of power amplifier output power and frequency of operation; and a processing circuit coupled to the variable impedance network, the control circuit, and the memory, the processing circuit for retrieving the plurality of control values stored in the memory and using the plurality of control values to generate the load control signal in response to the transmit power command and the channel frequency command.

2. The power amplifier load adjust system as in claim 1 further comprising a voltage monitoring circuit coupled to the processing circuit, the voltage monitoring circuit for detecting a voltage of the battery and generating an indication of the voltage, wherein the processing circuit produces the load control signal in response to the indication of the voltage, the transmit power command, and the channel frequency command.

3. The power amplifier load adjust system as in claim 1 wherein the plurality of control values stored in the memory correspond to amplifier load impedances that cause the power amplifier to have an efficiency greater than a predetermined amplifier efficiency over a plurality of frequencies within the predetermined band of frequencies.

4. The power amplifier load adjust system as in claim 1 wherein the plurality of control values stored in the memory correspond to amplifier load impedances that cause the power amplifier to operate at substantially a predetermined output power over a plurality of frequencies within the predetermined band of frequencies when a predetermined input power is applied to the power amplifier.

5. The power amplifier load adjust system as in claim 1 wherein the plurality of control values stored in the memory correspond to amplifier load impedances that cause the power amplifier to operate at substantially a predetermined output power and produce an adjacent channel power substantially less than a predetermined adjacent channel power when the power amplifier operates over each of a plurality of frequencies within the predetermined band of frequencies.

6. The power amplifier load adjust system as in claim 1 wherein the processing circuit uses the plurality of control values stored in the memory to calculate the load control signal using an equation.

7. The power amplifier load adjust system as in claim 1 wherein the processing circuit uses the plurality of control values stored in the memory to calculate the load control signal using an equation, the load control signal causing the variable impedance network to present load impedances to the output of the power amplifier that cause the power amplifier to have an efficiency greater than a predetermined amplifier efficiency over each of a plurality of frequencies within the predetermined band of frequencies.

8. The power amplifier load adjust system as in claim 1 wherein the processing circuit uses the plurality of control values stored in the memory to calculate the load control signal using an equation, the load control signal causing the variable impedance network to present load impedances to the output of the power amplifier that cause the power amplifier to operate at substantially a predetermined out put power over each of a plurality of frequencies within the predetermined band of frequencies when a predetermined input power is applied to the power amplifier.

9. The power amplifier load adjust system as in claim 1 wherein the processing circuit uses the plurality of control values stored in the memory to calculate the load control signal using an equation, the load control signal causing the variable impedance network to present load impedances to the output of the power amplifier that cause the power amplifier to operate at substantially a predetermined output power and to produce an adjacent channel power substantially less than a predetermined adjacent channel power when the power amplifier operates over each of a plurality of frequencies within the predetermined band of frequencies.

10. A power amplifier load adjust system for use in a radiotelephone, the radiotelephone operable over a predetermined band of frequencies, the power amplifier load adjust system comprising:

a power amplifier having an input and an output;

a variable impedance network coupled to the output of the power amplifier, the variable impedance network for presenting a plurality of impedances to the output of the power amplifier responsive to a load control signal;

a control circuit for generating a transmit power command and a channel frequency command;

a memory for storing a plurality of control values as a function of power amplifier output power and frequency of operation within the predetermined band of frequencies;

a processing circuit coupled to the variable impedance network, the control circuit, and the memory, the processing circuit for retrieving the plurality of control values stored in the memory and using the plurality of control values to generate a digital load control signal in response to the transmit power command and in response to the channel frequency command; and a digital-to-analog converter (DAC) coupled to the processing circuit and the variable is impedance network, the DAC for converting the digital load control signal to the load control signal.

11. A power amplifier load adjust system for use in a radiotelephone, the radiotelephone operable over a predetermined band of frequencies, the power amplifier load adjust system comprising:

a power amplifier having an input and an output;

a variable impedance network coupled to the output of the power amplifier, the variable impedance network for presenting a plurality of impedances to the output of the power amplifier responsive to a load control signal;

a control circuit for generating a transmit power command and a channel frequency command;

a memory for storing a plurality of control values as a function of power amplifier output power and frequency of operation within the predetermined band of frequencies; and a processing circuit coupled to the variable impedance network, the control circuit, and the memory, the processing circuit for retrieving the plurality of control values stored in the memory and using the plurality of control values to generate the load control signal in response to the transmit power command and in response to the channel frequency command, wherein a first set of the plurality of control values stored in the memory correspond to amplifier load impedances that cause the power amplifier to operate at substantially a first output power and produce an adjacent channel power substantially less than a predetermined adjacent channel power when the power amplifier operates over each of a plurality of frequencies within the predetermined band of frequencies.

12. The power amplifier load adjust system as in claim 11 wherein a second set of the plurality of control values stored in memory comprise offset values used by the processing circuit to calculate the load control signal when the power amplifier operates at a second output power, wherein the processing circuit calculates the load control signal to cause the variable impedance network to present load impedances to the output of the power amplifier, thereby causing the power amplifier to have an efficiency greater than a predetermined amplifier efficiency over each of the plurality of frequencies within the predetermined band of frequencies.

13. A method of controlling a variable impedance network at an output of a power amplifier operable in a radiotelephone, the method comprising:

determining a plurality of control values that cause the variable impedance network to present impedances to the output of the power amplifier to cause the power amplifier to produce less than a predetermined amount of adjacent channel power when the power amplifier operates at each of a plurality of frequencies and at least one predetermined output power;

storing the plurality of control values;

generating a transmit power command;

generating a channel frequency command;

generating a load control signal using the plurality of control values and in response to the transmit power command and the channel frequency command;

applying the load control signal to the variable impedance network; and presenting a load impedance to the output of the power amplifier responsive to the load control signal.

14. The method as in claim 13 further comprising:

calculating a control word using the plurality of control values, the transmit power command, and the channel frequency command; and applying the control word to a digital-to-analog converter (DAC), wherein the DAC uses the control word to generate the load control signal.

15. The method as in claim 3 further comprising generating a voltage level signal indicative of a battery voltage, wherein generating the load control signal is responsive to the voltage level signal.

* * * * *

UNITED STATES PATENT AND TRADEMARK OFFICE
CERTIFICATE OF CORRECTION

PATENT NO. : 6,556,814 B1
DATED : April 29, 2003
INVENTOR(S) : Armin Klomsdorf, Luke Edward Winkelman and Michael Landherr It is certified that error appears in the above-identified patent and that said Letters Patent is hereby corrected as shown below:

Column 18,
Line 16, claim 15 states, "The method as in claim 3" should state -- The method as in claim 13 --

Signed and Sealed this

Thirtieth Day of September, 2003

JAMES E. ROGAN
*Director of the United States Patent and Trademark Office*